(12) United States Patent
Yokotsuka et al.

(10) Patent No.: US 6,881,811 B2
(45) Date of Patent: Apr. 19, 2005

(54) FLUORINATED AROMATIC POLYMER AND USE THEREOF

(75) Inventors: Shunsuke Yokotsuka, Kanagawa (JP); Fusaaki Takeo, Kanagawa (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 10/754,601

(22) Filed: Jan. 12, 2004

(65) Prior Publication Data

US 2004/0147710 A1 Jul. 29, 2004

Related U.S. Application Data

(63) Continuation of application No. PCT/JP02/06589, filed on Jun. 28, 2002.

(30) Foreign Application Priority Data

Jul. 12, 2001 (JP) ........................................ 2001-212379

(51) Int. Cl.$^7$ .............................................. C08G 65/38
(52) U.S. Cl. ........................... 528/86; 528/212; 528/219
(58) Field of Search ........................... 528/86, 212, 219

(56) References Cited

U.S. PATENT DOCUMENTS

| | | | | |
|---|---|---|---|---|
| 5,114,780 A | * | 5/1992 | Mercer et al. | ............ 428/195.1 |
| 5,115,082 A | | 5/1992 | Mercer et al. | |
| 5,155,175 A | * | 10/1992 | Mercer et al. | ............... 525/390 |
| 5,959,157 A | | 9/1999 | Lau et al. | |
| 6,136,929 A | * | 10/2000 | Han et al. | .................... 525/534 |

FOREIGN PATENT DOCUMENTS

| | | |
|---|---|---|
| EP | 0 755 957 | 1/1997 |
| JP | 5-502257 | 4/1993 |
| JP | 10-247646 | 9/1998 |
| JP | 2001-247496 | 9/2001 |
| JP | 2001-302935 | 10/2001 |
| JP | 2002-203683 | 7/2002 |

OTHER PUBLICATIONS

Youichi Sakamoto et al., "Synthesis, Characterization, and Electron–Transport Property of Perfluorinated Phenylate Dendrimers," *J. Am. Chem. Soc.*, 2000, 122, 1832–1833.
Masamichi Ikai, et al., "Highly Efficient Phosphorescence from Organic Light–Emitting Devices with a Exciton–Block Layer," *Applied Physics Letter*, vol. 79, No. 2, Jul. 9, 2001, pp. 156–158.

Hyung–Jong Lee et al., "Crosslinkable Fluorinated Poly(arylene ethers) Bearing Phenyl Ethynyl Moiety for Low–Loss Polymer Optical Waveguide Devices," *Journal of Polymer Science: Part A: Polymer Chemistry*, 1988, 36, 2881–2887.

* cited by examiner

*Primary Examiner*—James J. Seidleck
*Assistant Examiner*—Irina S. Zemel
(74) *Attorney, Agent, or Firm*—Oblon, Spivak, McClelland, Maier & Neustadt, P.C.

(57) ABSTRACT

To provide a fluorinated aromatic polymer having excellent heat resistance and a low relative permittivity; and an insulating film for electronic devices and an insulating film for multilayered wiring boards, which are made of the polymer. A fluorinated aromatic polymer which contains two or more crosslinkable functional groups (A) per molecule and has a number average molecular weight of from $1 \times 10^3$ to $5 \times 10^5$ and an ether linkage and which is produced by e.g. a method in which a branched fluorinated aromatic compound (B) represented by the formula 1 and a compound (Y1) having a crosslinkable functional group (A) and a phenolic hydroxyl group, are subjected to a condensation reaction in the presence of a HF-removing agent:

Formula 1

20 Claims, No Drawings

FLUORINATED AROMATIC POLYMER AND USE THEREOF

TECHNICAL FIELD

The present invention relates to a fluorinated aromatic polymer and use thereof.

BACKGROUND ART

Electronic devices and multilayered wiring boards, etc. have been increasingly microsized and highly integrated, and an insulating film having a lower relative permittivity is required for application thereto. In order to satisfy such a requirement and to secure heat resistance of at least 350° C., preferably at least 425° C., which is required in the process for producing electronic devices or multilayered wiring boards, fluorinated aromatic polymers (hereinafter referred to as FAP) are being studied.

For example, Japanese Patent 3,064,011, U.S. Pat. Nos. 5,115,082, 5,959,157, JP-A-9-202824, JP-A-10-247646, J. Polm. Sci.; Part A; Polm. Chem., vol. 36, 2881 (1998), etc. disclose fluorinated aromatic polymers having ether linkages (hereinafter referred to as polyarylene ethers or PAE) as FAP. Their relative permittivities are from about 2.5 to 2.9, and their application to insulating films for electronic devices or multilayered wiring boards (hereinafter referred to as the present insulating films) is also being studied.

The arylene structure in such PAE may, for example, be perfluorophenylene, perfluorobiphenylene or perfluoronaphthanylene. And, PAE is linear, and its glass transition temperature (hereinafter referred to as Tg) is low, and thus, the heat resistance is not sufficient. If a crosslinkable functional group is introduced into PAE for crosslinking, Tg can be made high, but the relative permittivity will increase to a level of from 2.7 to 3.0, whereby it is difficult to satisfy both a low relative permittivity and high Tg simultaneously.

Bull. Chem. Soc. Jpn., 66, 1053 (1993), etc. disclose a fluorinated poly(1,4-phenylene) as linear FAP, but no application to the present insulating film is disclosed. Further, if the polymerization degree exceeds 3, the solubility in a solvent substantially decreases, and a coating property required by the present insulating film will be lost, and further, it will be sublimated by heat treatment during the process for producing an insulating film, whereby it can not be applied to the present insulating film.

J. Am. Chem. Soc., 122, 1832 (2000) discloses dendrimers as FAP having branched structures. These dendrimers can be dissolved in a solvent, but Tg is as low as lower than 140° C., and they have sublimability, whereby they can not be applied to the present insulating films.

The purpose of the present invention is to provide FAP having a low relative permittivity and high heat resistance, and its use as an insulating film.

DISCLOSURE OF THE INVENTION

The present invention provides a fluorinated aromatic polymer which contains two or more crosslinkable functional groups (A) per molecule and has a number average molecular weight of from $1\times10^3$ to $5\times10^5$ and an ether linkage and which is produced from a branched fluorinated aromatic compound (B) represented by the following formula 1 by at least one method selected from the group consisting of the following methods ①, ② and ③

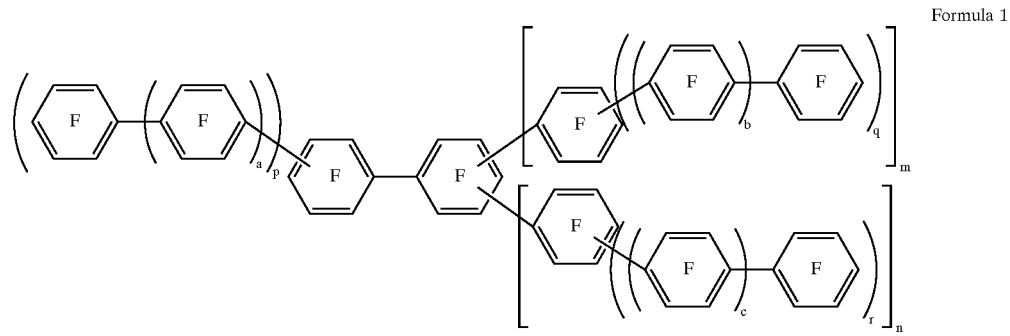

Formula 1 wherein each of m and n which are independent of each other, is an integer of from 1 to 4, each of p, q and r which are independent of one another, is 0 or an integer of from 1 to 5, and each of a, b and c which are independent of one another, is 0 or an integer of from 1 to 3, provided that $2 \leq m+n \leq 5$;

① a method in which a branched fluorinated aromatic compound (B) represented by the above formula 1 and a compound (Y1) having a crosslinkable functional group (A) and a phenolic hydroxyl group, are subjected to a condensation reaction in the presence of a HF-removing agent;

② A method in which the fluorinated aromatic compound (B), a compound (Y1) having a crosslinkable functional group (A) and a phenolic hydroxyl group, and a compound (Y2) having no crosslinkable functional group and two or more phenolic hydroxyl groups, are subjected to a condensation reaction in the presence of a HF-removing agent;

③ A method in which the fluorinated aromatic compound (B), an aromatic compound (Z) having a crosslinkable functional group (A) and having a fluorinated substituent on the aromatic ring, and a compound (Y2) having no crosslinkable functional group and two or more phenolic hydroxyl groups, are subjected to a condensation reaction in the presence of a HF-removing agent.

Further, the present invention provides an insulating film for electronic devices and an insulating film for multilayered wiring boards, which are made of such FAP.

BEST MODE FOR CARRYING OUT THE INVENTION

FAP of the present invention is FAP which contains two or more crosslinkable functional groups (A) per molecule and has a number average molecular weight of from $1 \times 10^3$ to $5 \times 10^5$ and an ether linkage and which is produced from a branched fluorinated aromatic compound (B) represented by the following formula 1 by at least one method selected from the group consisting of the following methods ①, ② and ③:

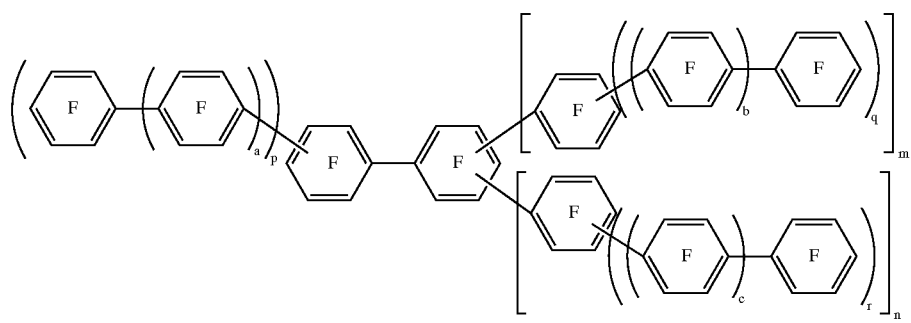

Formula 1 wherein each of m and n which are independent of each other, is an integer of from 1 to 4, each of p, q and r which are independent of one another, is 0 or an integer of from 1 to 5, and each of a, b and c which are independent of one another, is 0 or an integer of from 1 to 3, provided that $2 \leq m+n \leq 5$;

① A method in which a branched fluorinated aromatic compound (B) represented by the above formula 1 and a compound (Y1) having a crosslinkable functional group (A) and a phenolic hydroxyl group, are subjected to a condensation reaction in the presence of a HF-removing agent;

② A method in which the fluorinated aromatic compound (B), a compound (Y1) having a crosslinkable functional group (A) and a phenolic hydroxyl group, and a compound (Y2) having no crosslinkable functional group and two or more phenolic hydroxyl groups, are subjected to a condensation reaction in the presence of a HF-removing agent;

③ A method in which the fluorinated aromatic compound (B), an aromatic compound (Z) having a crosslinkable functional group (A) and having a fluorinated substituent on the aromatic ring, and a compound (Y2) having no crosslinkable functional group and two or more phenolic hydroxyl groups, are subjected to a condensation reaction in the presence of a HF-removing agent.

In the present invention, the branched fluorinated aromatic compound (B) is a fluorinated aromatic compound represented by the above formula 1. Preferably, n+m is from 2 to 3, each of p, q and r which are independent of one another, is from 0 to 3, and each of a, b and c which are independent of one another, is from 0 to 2. It is preferred that the respective values are in these ranges, whereby FAP will be excellent in the solubility in a solvent, and production of the fluorinated aromatic compound (B) will be easy.

The fluorinated aromatic compound (B) more preferably has a structure of the following formula 3.

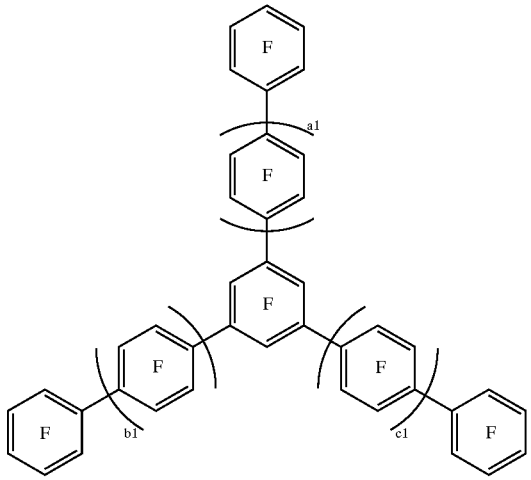

Formula 3

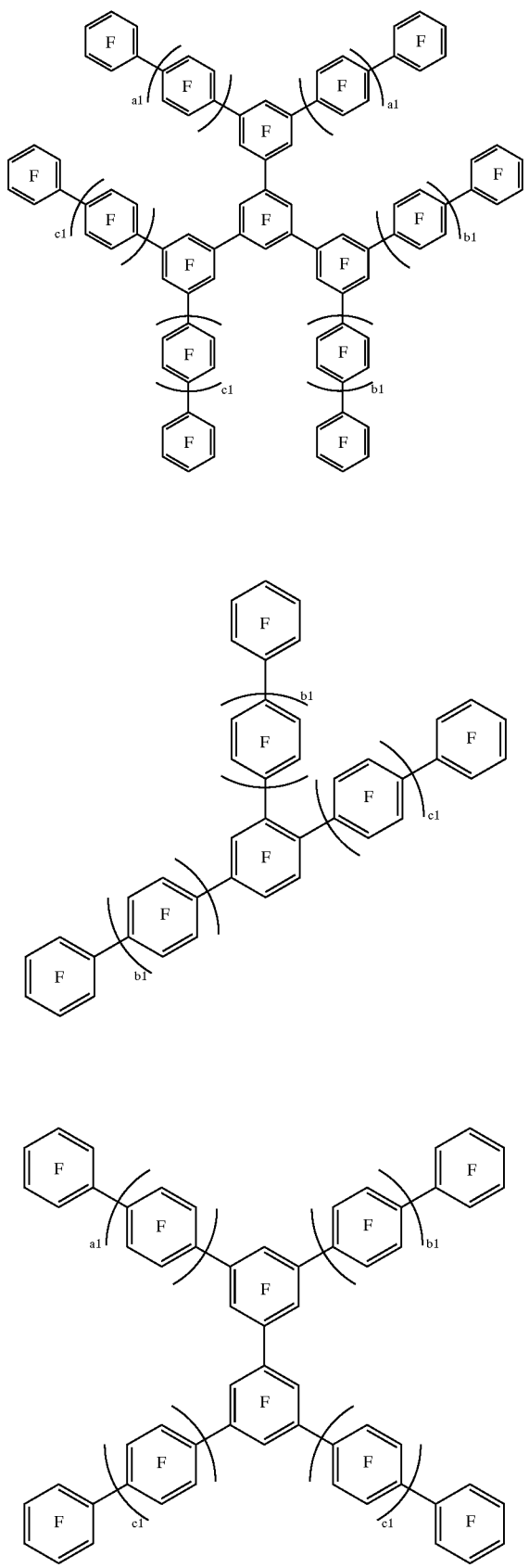

Here, it is more preferred that each of a1, b1 and c1 which are independent of one another, is 0, 1 or 2, whereby it is possible to obtain FAP having a high glass transition temperature and being excellent in the solubility in a solvent.

As specific examples of the fluorinated aromatic compound (B), the structures represented by the following formula 4 may be mentioned. These may be used alone or in combination as a mixture of two or more of them.

Most preferred is perfluoro(1,3,5-triphenylbenzene) or perfluoro(1,2,4-triphenylbenzene), represented by the following formula 2.

Formula 4

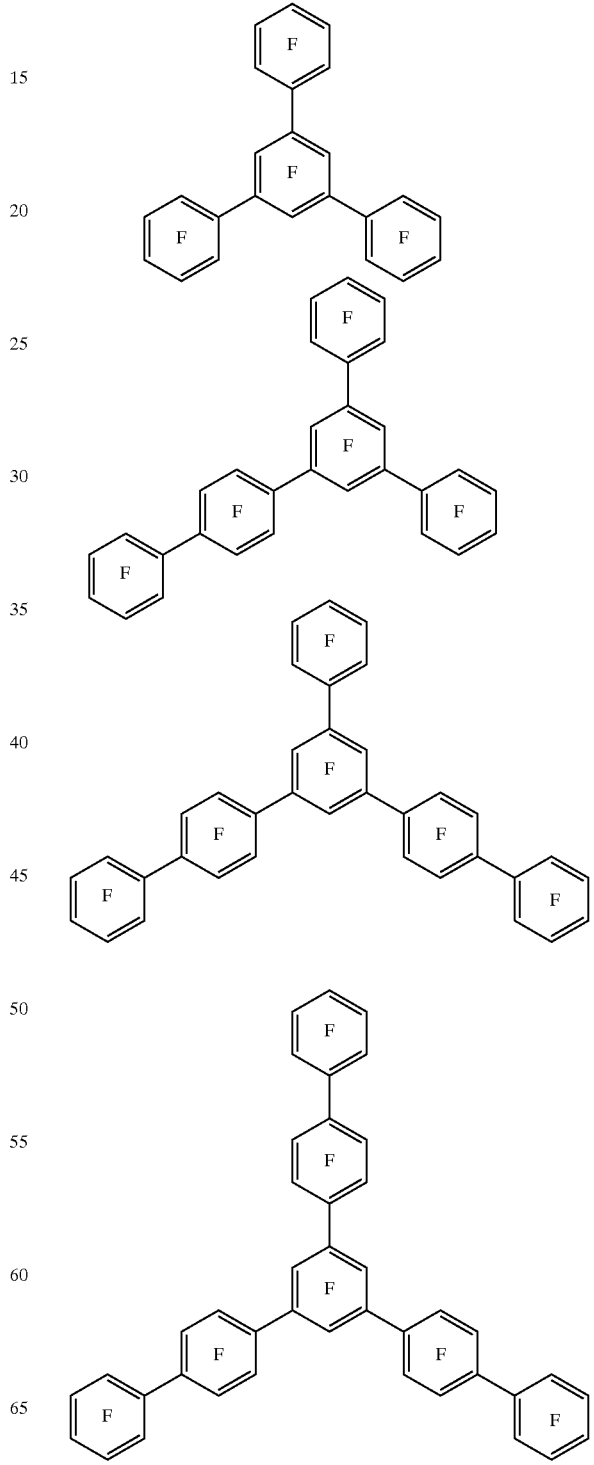

-continued
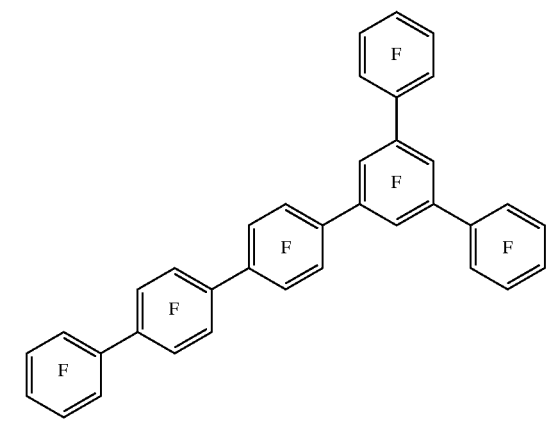
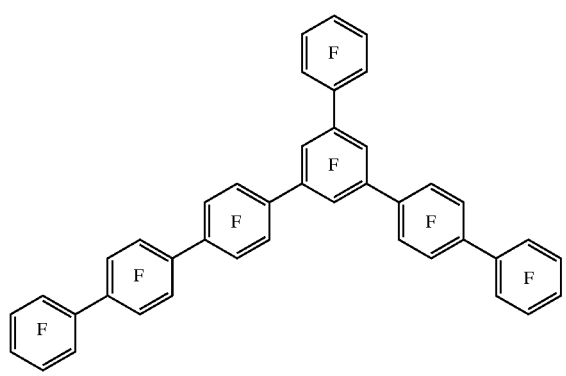
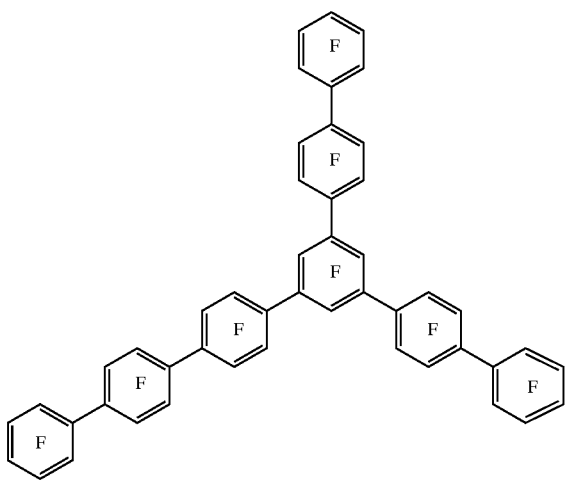
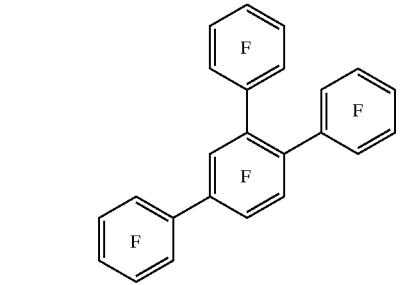
-continued
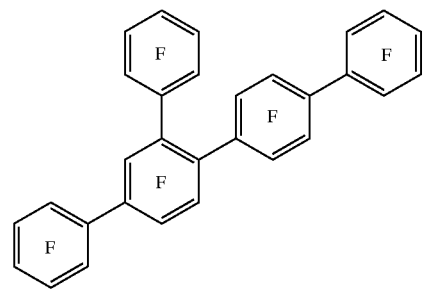
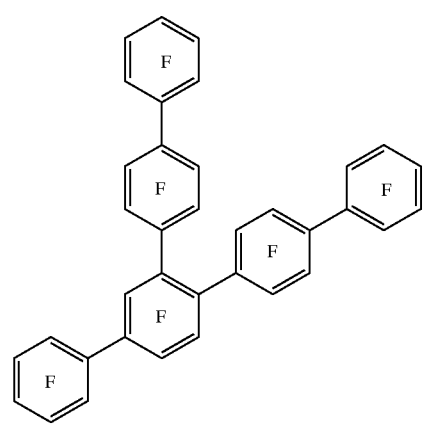
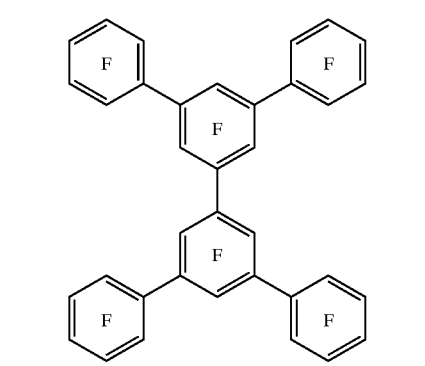
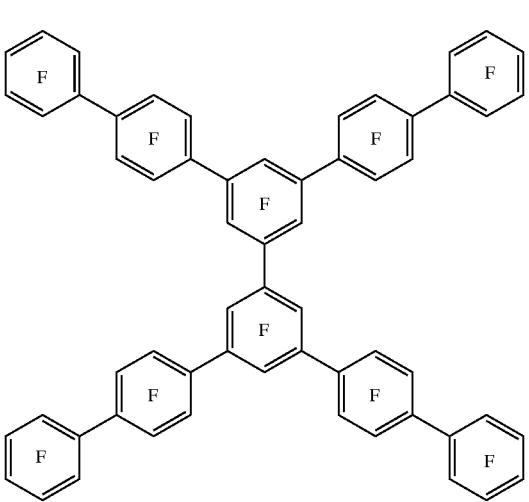

-continued

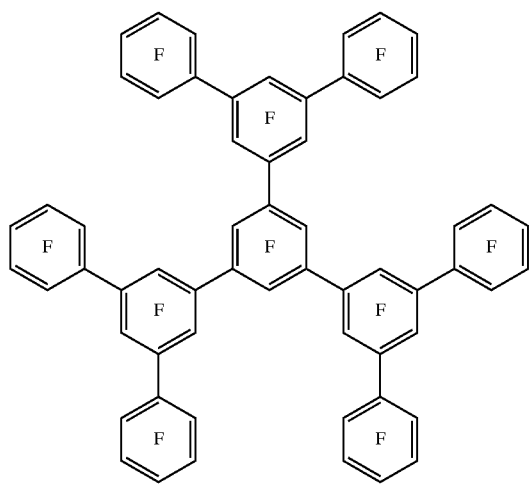

Formula 2

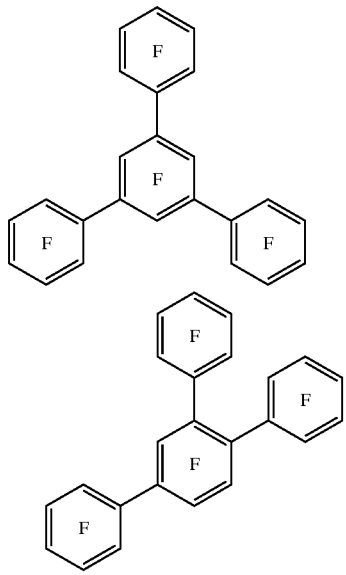

FAP of the present invention contains two or more crosslinkable functional groups (A) per molecule. It contains preferably from 2 to 30, more preferably from 3 to 20 such functional groups. By the crosslinkable functional groups (A), a crosslinking or chain-extending reaction among FAP molecules will proceed, whereby the heat resistance and solvent resistance of FAP will be improved.

The crosslinkable functional groups (A) are preferably functional groups which are crosslinkable by heat, light, electron beam, etc. Functional groups crosslinkable by heat are more preferred, since they are excellent in the applicability to a process for producing electronic devices or multilayered wiring boards. Further, crosslinkable functional groups (A) containing no polar group are preferred, since they increase the relative permittivity of FAP.

As specific examples of the crosslinkable functional group (A), an ethynyl group, a 1-oxocyclopenta-2,5-dien-3-yl group (hereinafter referred to also as a cyclopentadienone group), a cyano group, an alkoxy silyl group, a diarylhydroxymethyl group, and a hydroxyfluorenyl group, may, for example, be mentioned. From the viewpoint of the heat resistance, an ethynyl group is more preferred.

The content of the crosslinkable functional groups (A) in FAP of the present invention, is such that the crosslinkable functional groups (A) are preferably in a proportion of from 0.05 to 6 mol, more preferably in a proportion of from 0.1 to 4 mol, per mol of the fluorinated aromatic compound (B). If the content exceeds this range, brittleness of the FAP coating film tends to increase, and the relative permittivity is likely to increase. On the other hand, if the content is less than this range, the heat resistance and the solvent resistance tend to deteriorate.

FAP of the present invention can be produced by at least one method selected from the group consisting of the following methods ①, ② and ③:

① A method in which a branched fluorinated aromatic compound (B) represented by the above formula 1 and a compound (Y1) having a crosslinkable functional group (A) and a phenolic hydroxyl group, are subjected to a condensation reaction in the presence of a HF-removing agent;

② A method in which the fluorinated aromatic compound (B), a compound (Y1) having a crosslinkable functional group (A) and a phenolic hydroxyl group, and a compound (Y2) having no crosslinkable functional group and two or more phenolic hydroxyl groups, are subjected to a condensation reaction in the presence of a HF-removing agent;

③ A method in which the fluorinated aromatic compound (B), an aromatic compound (Z) having a crosslinkable functional group (A) and having a fluorinated substituent on the aromatic ring, and a compound (Y2) having no crosslinkable functional group and two or more phenolic hydroxyl groups, are subjected to a condensation reaction in the presence of a HF-removing agent.

As shown in the following formula 5, in the condensation reaction in each of the methods ①, ② and ③ for producing FAP, an ether linkage will be formed by e.g. a reaction mechanism in which a phenoxy group (—O⁻ group) led from a phenolic hydroxyl group (—OH group), will attack the carbon atom to which a fluorine atom of the fluorinated aromatic compound (B) is bonded, whereupon the fluorine atom is detached. Further, in a case where the compound (Y2) has two phenolic hydroxyl groups which are in an ortho position to each other, it is possible that a dioxin skeleton will be formed as shown in the following formula 6 by e.g. a similar reaction mechanism.

Formula 5

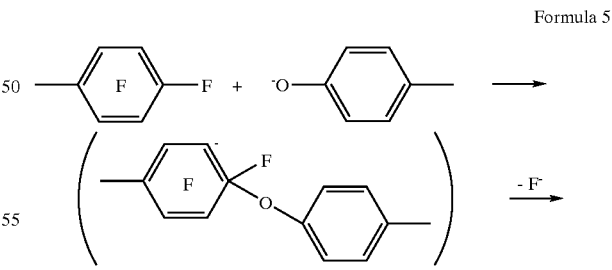

Formula 6

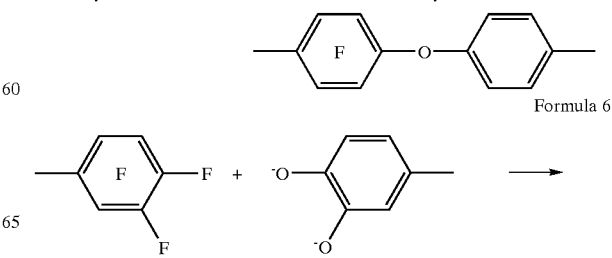

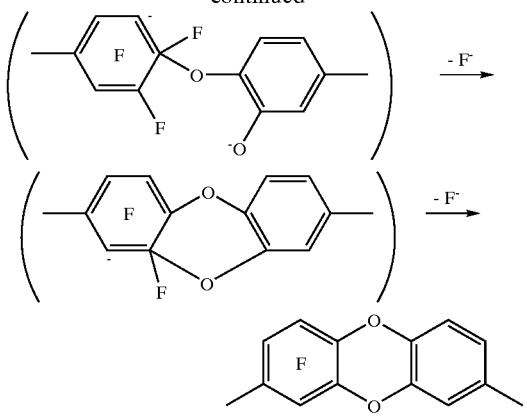

As the compound (Y1) having a crosslinkable functional group (A) and a phenolic hydroxyl group, an aromatic compound having an ethynyl group as the crosslinkable functional group, is more preferred.

As a specific example of the compound (Y1) having one phenolic hydroxyl group, an ethynyl phenol such as 3-ethynylphenol, 4-phenylethynylphenol or 4-(4-fluorophenyl)ethynylphenol, may, for example, be mentioned.

As a specific example of the compound (Y1) having two or more phenolic hydroxyl groups, a bis(phenylethynyl) hydroxylphenyl such as 2,2'-bis (phenylethynyl)-5,5'-dihydroxybiphenyl or 2,2'-bis (phenylethynyl)-4,4'-dihydroxybiphenyl, or a dihydroxyphenylacetylene such as 4,4'-dihydroxytran or 3,3'-dihydroxytran, may, for example, be mentioned. These compounds may be used alone or in combination as a mixture of two or more of them.

As the compound (Y2) having two ore more phenolic hydroxyl groups, a polyfunctional phenol is preferred. Its specific examples include dihydroxybenzene, dihydroxybiphenyl, dihydroxyterphenyl, dihydroxynaphthalene, dihydroxyanthracene, dihydroxyphenanthracene, dihydroxy-9,9-diphenylfluorene, dihydroxydibenzofuran, dihydroxydiphenyl ether, dihydroxydiphenyl thioether, dihydroxybenzophenone, dihydroxy-2,2-diphenylpropane, dihydroxy-2,2-diphenylhexafluoropropane, dihydroxybinaphthyl, tetraphenylhydroquinone, hexaphenyldihydroxybiphenyl, trihydroxybenzene, trihydroxybiphenyl, trihydroxynaphthalene, tetrahydroxybenzene, tetrahydroxybiphenyl, tetrahydroxybinaphthyl and tetrahydroxyspiroindans.

Dihydroxybenzene, dihydroxy-9,9-diphenylfluorene, dihydroxy-2,2-diphenylhexafluoropropane, tetraphenylhydroquinone and trihydroxybenzene are more preferred, since FAP thereby obtainable will have a low relative permittivity and high heat resistance.

As the aromatic compound (Z) having a crosslinkable functional group and having a fluorinated substituent on the aromatic ring, a perfluorinated aromatic compound such as perflurophenyl or perfluorobiphenyl, having an ethynyl group as the crosslinkable functional group, is preferred. Its specific examples include a fluorinated arylacetylene such as pentafluorophenylacetylene or nonafluorobiphenylacetylene, and a fluorinated diarylacetylene such as phenylethynylpentafluorobenzene, phenylethynylnonafluorobiphenyl or decafluorotran. These compounds may be used alone or in combination as a mixture of two or more of them.

In the present invention, the HF-removing agent is preferably a basic compound, particularly preferably a carbonate, hydrogencarbonate or hydroxide of an alkali metal. Specific examples include sodium carbonate, potassium carbonate, sodium hydrogencarbonate, potassium hydrogencarbonate, sodium hydroxide and potassium hydroxide.

The amount of the HF-removing agent is required to be at least 1-time, preferably from 1.1 to 3-times by molar ratio to the number of mols of the phenolic hydroxyl group in the compound (Y1) in the method ①. In the method ②, it is required to be at least 1-time, preferably from 1.1 to 3-times, by molar ratio to the total number of mols of the phenolic hydroxyl group in the compound (Y1) and the compound (Y2). In the method ③, it is required to be at least 1-time, preferably from 1.1 to 3-times, by molar ratio to the number of mols of the phenolic hydroxyl group in the compound (Y2).

In each of the methods ①, ② and ③, the condensation reaction is preferably carried out in a polar solvent. The polar solvent is preferably a solvent containing an aprotic polar solvent such as N,N-dimethylacetamide, N,N-dimethylformaide, N-methylpyrrolidone, ethylsulfoxide or sulfolane. The polar solvent may contain toluene, xylene, benzene, benztrifluoride, xylenehexafluoride or the like within a range not to adversely affect the condensation reaction and not to lower the solubility of the resulting FAP.

The condensation reaction conditions are preferably from 10 to 200° C. and from 1 to 80 hours, more preferably from 60 to 180° C. and from 2 to 60 hours, most preferably from 80 to 160° C. and from 3 to 24 hours.

The number average molecular weight of FAP of the present invention is from 500 to 1,000,000. If it is within this range, the coating characteristics will be good, and the coated film thereby obtained will have good heat resistance, mechanical characteristics and solvent resistance, etc. It is preferably from 1,000 to 500,000, more preferably from 1,500 to 100,000. In the application to an insulating film for electronic devices, when a property (so-called a gap-filling and planarization ability) to sufficiently penetrate into fine spaces of the substrate and to planarize the surface, is required, the number average molecular weight is most preferably from 1,500 to 50,000.

The number average molecular weight of FAP may be controlled by changing the charging ratio of the fluorinated aromatic compound (B) to the compound (Y1) in the method ①. Likewise, it can be controlled by changing the charging ratio of the fluorinated aromatic compound (B), the compound (Y1) and the compound (Y2) in the method ②, or the charging ratio of the fluorinated aromatic compound (B), the aromatic compound (Z) and the compound (Y2) in the method ③.

In the method ①, the amount of the compound (Y1) is preferably from 2 to 6 times, more preferably from 2 to 4 times, by molar ratio to the fluorinated aromatic compound (B). In the method ②, the amount of the compound (Y1) is preferably from 0.3 to 3 times, more preferably from 0.8 to 2 times, by molar ratio to the fluorinated aromatic compound (B), and the amount of the compound (Y2) is preferably from 0.3 to 2 times, more preferably from 0.5 to 1.5 times, by molar ratio to the fluorinated aromatic compound (B).

In the method ③, the amount of the compound (Z) is preferably from 0.3 to 3 times, more preferably from 0.5 to 2 times, by molar ratio to the fluorinated aromatic compound (B), and the amount of the compound (Y2) is preferably from 0.5 to 2 times, more preferably from 0.8 to 1.8 times, by molar ratio to the fluorinated aromatic compound (B). It is preferred that the respective values are within these ranges, whereby the resulting FAP will have a low relative permittivity and high heat resistance.

In the present invention, in a case where the solubility of FAP obtained by any one of the method ①, ② and ③ is inadequate, or the coating film FAP is brittle, it is preferred to add a co-condensable component at the time of the production of FAP in order to improve the solubility of FAP or in order to improve the flexibility.

As such a co-condensable component, a non-branched monocyclic or polycyclic fluorinated aromatic compound (W) is preferred, and a perfluoroaromatic compound is more preferred. Specific examples thereof may be perfluorobenzene, perfluorotoluene, perfluoroxylene, perfluorobiphenyl, perfluoroterphenyl, perfluoronaphthalene and perfluoroanthracene. These compounds may be used alone or in combination as a mixture of two or more of them.

The amount of the fluorinated aromatic compound (W) is preferably from 1 to 100 mass %, more preferably from 10 to 150 mass %, based on the fluorinated aromatic compound (B). If it is too much, the heat resistance of the coating film thereby obtainable, tends to be low, and if it is too small, the effect for improving the flexibility or the solubility tends to be inadequate.

After the condensation reaction or after being made into a solution, FAP of the present invention will be refined by a method such as neutralization, reprecipitation, extraction or filtration. In its application to an insulating film for electronic devices or an insulating film for multilayered wiring boards, metals such as potassium, sodium, etc. as the HF-removing agent employed during the condensation reaction and liberated halogen atoms, are likely to be substances which cause operation failures of transistors or corrosion of wirings, and it is preferably sufficiently purified.

At the time of the crosslinking reaction of FPA of the present invention, it is also preferred to use various catalysts or additives for the purpose of increasing the crosslinking reaction rate or reducing reaction defects.

In a case where FAP of the present invention contains ethynyl groups as the crosslinkable functional groups (A), the catalyst may, for example, be an amine such as aniline, triethylamine, aminophenyltrialkoxysilane or aminopropyltrialkoxysilane, or an organic metal compound containing molybdenum or nickel. The amount of the catalyst to be added, is preferably from 0.01 to 1 mol, more preferably from 0.05 to 0.5 mol, per mol of ethynyl groups in FAP.

As an additive, a biscyclopentadienone derivative is preferred. An ethynyl group and a cyclopentadienone group (a 1-oxocyclopenta-2,5-dien-3-yl group) will form an adduct by a Diels-Alder reaction under heating, followed by a carbon monoxide-removal reaction, to form an aromatic ring. Accordingly, when a biscyclopentadienone derivative is used, a crosslinkage or chain extension will be formed wherein the aromatic ring constitutes a connecting site.

Specific examples of the biscyclopentadienone derivative may, for example, be 1,4-bis(1-oxo-2,4,5-triphenyl-cyclopenta-2,5-dien-3-yl)benzene, 4,4'-bis(1-oxo-2,4,5-triphenyl-cyclopenta-2,5-dien-3-yl) biphenyl, 4,4'-bis(1-oxo-2,4,5-triphenyl-cyclopenta-2,5-dien-3-yl) 1,1'-oxybisbenzene, 4,4'-bis(1-oxo-2,4,5-triphenyl-cyclopenta-2,5-dien-3-yl)1,1'-thiobisbenzene, 1,4-bis(1-oxo-2,5-di-[4-fluorophenyl]-4-phenyl-cyclopenta-2,5-dien-3-yl)benzene, 4,4'-bis(1-oxo-2,4,5-triphenyl-cyclopenta-2,5-dien-3-yl)1,1'-(1,2-ethanediyl)bisbenzene, and 4,4'-bis(1-oxo-2,4,5-triphenyl-cyclopenta-2,5-dien-3-yl)1,1'-(1,3-propanediyl)bisbenzene.

Among these biscyclopentadienone derivatives, a biscyclopentadienone derivative of an entirely aromatic skeleton, is preferred from the viewpoint of the heat resistance. These derivatives may be used alone or in combination as a mixture of two or more of them. The amount of the biscyclopentadienone derivative is preferably from 0.1 to 0.5 time, more preferably from 0.15 to 0.5 time, by molar ratio to the number of mols of ethynyl groups in FAP.

FAP of the present invention is usually practically employed as dissolved in a solvent. Here, it is preferred that the functional groups (A) in FAP will not react in the solution and will undergo a crosslinking reaction in the heating (baking) step after the film forming.

In a case where a crosslinking catalyst or an additive is added to the FAP solution, or FAP contains a low molecular weight substance having a vapor pressure, it is also preferred to react part of the crosslinkable functional groups (A) to themselves and/or to the catalyst or the additive in the solution, in order to prevent evaporation during the baking.

As such a method, heating is preferred. The heating conditions are preferably from 50° C. to 250° C. and from 1 to 50 hours, more preferably from 70 to 200° C. and from 1 to 20 hours. The reaction rate of the crosslinkable functional group in the solution is adjusted to be preferably less than 50%, more preferably less than 30%, with a view to preventing gelation of FAP in the solution.

As the solvent for FAP of the present invention, there is no particular limitation, so long as it is capable of effectively dissolving FAP and the catalyst or the additive and a coating film having a desired thickness, uniformity or gap-filling and planarization ability, can be obtained by a desired method. For example, an aromatic hydrocarbon, a bipolar aprotic solvent, a ketone, an ester, an ether, or a halogenated hydrocarbon may be mentioned.

The aromatic hydrocarbon may, for example, be benzene, toluene, xylene, ethylbenzene, cumene, mesitylene, tetralin or methyl naphthalene.

The bipolar aprotic solvent may, for example, be N-methyl pyrrolidone, N,N-dimethylformamide, N,N-dimethylacetamide, γ-butyrolactone or dimethylsulfoxide.

The ketone may, for example, be cyclopentanone, cyclohexanone, cycloheptanone, cyclooctanone or methyl amyl ketone.

The ether may, for example, be tetrahydrofuran, pyran, dioxane, dimethoxyethane, diethoxyethane, diphenyl ether, anisole, phenetole, diglyme or triglyme.

The ester may, for example, be ethyl lactate, methyl benzoate, ethyl benzoate, butyl benzoate, benzyl benzoate, methyl cellosolve acetate, ethyl cellosolve acetate, propylene glycol monomethyl ether, propylene glycol monoethyl ether, propylene glycol monopropyl ether, propylene glycol monobutyl ether, or propylene glycol monoethyl ether acetate.

The halogenated hydrocarbon may, for example, be carbon tetrachloride, chloroform, methylene chloride, tetrachloroethylene, chlorobenzene or dichlorobenzene.

The concentration of FAP is preferably from 1 to 50 mass %, more preferably from 5 to 30 mass %.

As a method for forming a coating film for FAP of the present invention, a known coating method may be mentioned, such as spin coating, dip coating, spray coating, die coating, bar coating, doctor coating, extrusion coating, scan coating, brush coating or potting. When it is used as an insulating film for electronic devices, spin coating or scan coating is preferred from the viewpoint of the uniformity of the film thickness. After the coating, baking (heating) is carried out to evaporate the solvent and to complete the crosslinking or chain-extending reaction. The baking conditions are preferably from 200 to 450° C. and from 1 to 120 minutes, more preferably from 300 to 425° C. and from 2 to 60 minutes.

The thickness of the FAP coating film is preferably from 0.01 to 50 μm, more preferably from 0.1 to 30 μm. In order to secure the surface smoothness of the coating film or to improve the fine space gap-filling ability of the coating film, it is also possible to add a step for prebaking at a temperature of from about 50 to 250° C. or to carry out the baking step by dividing it into a few stages.

In order to improve the adhesion between the substrate and FAP of the present invention, it is also preferred to use an adhesion promoter. The adhesion promoter may, for example, be a silane type coupling agent, a titanate type coupling agent or an aluminum type coupling agent, and a silane type coupling agent such as an epoxysilane or an aminosilane, is preferred. The aminosilane may, for example, be an aliphatic aminosilane such as γ-aminopropylmethyldiethoxysilane or γ-aminopropyltriethoxysilane, or an aromatic group-containing aminosilane such as aminophenyltrimethoxysilane, aminophenyltriethoxysilane, or N-phenyl-γ-aminopropyltrimethoxysilane.

As a method for applying the adhesion promoter, preferred is a method of treating the substrate with the adhesion promoter prior to the coating of the FAP solution or a method of adding the adhesion promoter to the FAP solution. As the method of treating the substrate with the adhesion promoter, in the case of an aminosilane, a method of spin coating it in the form of a 0.01 to 3 mass % alcohol solution on the substrate may be mentioned. In the method of adding the adhesion promoter to the FAP solution, the amount of the adhesion promoter is preferably from 0.05 to 10 mass %, more preferably from 0.1 to 5 mass %, based on FAP contained. If the amount of the adhesion promoter is too small, no adequate effect for improving the adhesion will be obtained, and if it is too much, the electric characteristics or heat resistance tends to deteriorate.

As applications of FAP of the present invention, a protective film, a film material for various cells such as fuel cells, a photoresist, an optical waveguide material, a coating material, an electronic component, a sealing agent, an overcoating agent, a transparent film material, an adhesive, a fiber material, a weather-resistant coating material, a water repellent, an oil repellent and a moisture proof coating agent may, for example, be mentioned. Especially, an application to an insulating film for electronic devices or an insulating film for multilayered wiring boards, is preferred.

The electronic devices may, for example, be an independent semiconductor such as a diode, a transistor, a compound semiconductor, a thermistor, a varistor or a thyristor, a memory element such as DRAM (dynamic random access memory), SRAM (static random access memory), EPROM (erasable programmable read only memory), mask ROM (mask read only memory), EEPROM (electrical erasable programmable read only memory) or a flash memory, a theoretical circuit element such as a microprocessor, DSP or ASIC, an integrated circuit element such as a compound semiconductor represented by MMIC (monolithic microwave integrated circuit), a hybrid integrated circuit (hybrid IC), and a photoelectric conversion element such as a light emitting diode or a charge-coupled device.

The multilayered wiring boards may be various substrates for mounting electronic devices, etc., and high density wiring boards such as printed wiring boards, build-up wiring boards and MCM may, for example, be mentioned.

As the insulating film, a buffer coating film, a passivation film, an interlayer insulating film, an α-ray shielding film may, for example, be mentioned.

In an application to an insulating film for electronic devices or an insulating film for multilayered wiring boards, employing the FAP coating film, it is also preferred that the FAP insulating film contains void holes, in order to obtain an insulating film having a lower relative permittivity. The following two methods may, for example, be mentioned as the method of introducing such void holes.

(1) A method wherein FAP of the present invention and a polymer having a low thermal decomposition temperature (hereinafter referred to as a thermally decomposable polymer) are complexed, and the thermally decomposable polymer portions will be removed in the process for forming the insulating film.

(2) A method wherein fine particles to be dispersed, are added to FAP of the present invention, and the fine particle portions will be removed in the process for forming the insulating film or after forming the insulating film.

In the method (1), the thermally decomposable polymer may, for example, be an aliphatic polyether, an aliphatic polyester, an acrylic polymer or a styrene type polymer. The molecular weight of the thermally decomposable polymer is preferably from 1,000 to 100,000, more preferably from 1,000 to 50,000. It is preferred that the molecular weight is within this range, since the compatibility with FAP can be secured. As a method for complexing FAP and the thermally decomposable polymer, a method of preparing a solution mixture of FAP and the thermally decomposable polymer, followed by film forming to obtain a composite film, or a method of blocking or grafting FAP with the thermally decomposable polymer for complexing, may, for example, be mentioned.

As the blocking or grafting method, a known method may be employed, and for example, a technique may be mentioned wherein a thermally decomposable polymer having a terminal fluorinated aromatic ring or phenolic hydroxyl group, is prepared and co-condensed at the time of condensation reaction of the synthesis of FAP. The condensation reaction of FAP will proceed in accordance with the reaction mechanism of the above formula 5 or 6, whereby the terminal fluorinated aromatic ring or phenolic hydroxyl group moiety will be bonded to a FAP chain. Here, in a case where the thermally decomposable polymer has a fluorinated aromatic ring or a phenolic hydroxyl group at one terminal, FAP having the thermally decomposable polymer grafted thereto, can be obtained. In a case where the thermally decomposable polymer has fluorinated aromatic rings or phenolic hydroxyl groups at both terminals, a blocked product of FAP and the thermally decomposable polymer can be obtained.

The thermally decomposable polymer has a low thermal decomposition temperature, whereby it will be selectively decomposed and removed by heating during the forming of the insulating film, and the removed portions will be void holes. It is possible to control the porosity by the amount of the thermally decomposable polymer to be added. The amount to be added is usually preferably from 5 to 80 vol %, more preferably from 10 to 70 vol %, based on FAP.

In the method (2), the fine particles to be dispersed in FAP of the present invention are preferably inorganic fine particles. As such inorganic fine particles, fine particles of silica or metal may, for example, be mentioned. The fine particles will be dissolved and removed by e.g. acid treatment after the film forming, and the removed portions will be void holes. It is possible to control the porosity by the amount of the fine particles to be added. The amount to be added is usually preferably from 5 to 80 vol %, more preferably from 10 to 70 vol %, based on FAP.

It is also preferred that the coating film of FAP is combined with another film. For example, when it is applied to a passivation film for a semiconductor element or an interlayer insulating film for a semiconductor element, it is preferred to form an inorganic film as a lower layer and/or an upper layer of a FAP coating film.

The inorganic film may for example, be a film formed by a normal pressure, reduced pressure or plasma chemical vapor deposition (CVD) method or a coating method. For example, a so-called PSG film or BPSG film, having phosphorus and/or boron doped to a silicon oxide film, as the case requires, a silicon oxide film, a silicon nitride film, a silicon oxynitride film, a SiOC film, or a spin-on glass (SOG) film may be mentioned.

By forming an inorganic film between a FAP coating film and a metal wiring, it is possible to prevent peeling of the metal wiring and to facilitate etching processing for e.g. a Damascene shape. It is also preferred that such an inorganic film is formed as an upper layer of a FAP coating film after partially removing the FAP coating film by an etch back process or a CMP (chemical mechanical polishing) process.

When an inorganic film is to be formed as an upper layer of a FAP coating film, if the adhesion between the FAP coating film and the inorganic film is inadequate, or film reduction takes place at the time of forming the inorganic film, it is preferred to apply the following two methods.

(I) A method of forming a multilayered inorganic film: When a silicon oxide film is to be formed by a plasma CVD method, film reduction will take place depending upon the composition of gas to be used. In such a case, firstly, a thin film of an inorganic film which causes no film reduction, such as a silicon nitride film or a normal pressure CVD-silicon oxide film, is formed. Then, using this thin film as a barrier layer, a silicon oxide film is formed.

(II) A method of treating a FAP coating film with energy rays: In some cases, treatment with energy rays brings about an effect to improve the interfacial adhesion between a FAP coating film and an inorganic film. Such treatment with energy rays may, for example, be treatment utilizing electromagnetic waves in a broad sense including light, such as UV irradiation, laser irradiation or microwave irradiation, or treatment utilizing electron beam, such as electron irradiation, glow discharge treatment, corona discharge treatment or plasma treatment.

Among them, as a treating method suitable for a mass production step for semiconductor elements, UV irradiation, laser irradiation, corona discharge treatment or plasma treatment may be mentioned.

Plasma treatment is more preferred, since the damage to be imparted to a semiconductor element is thereby small. The apparatus to carry out the plasma treatment is not particularly limited so long as the desired gas can be introduced into the apparatus, and the electric field can be applied. A commercially available barrel type or parallel flat plate type plasma-generation apparatus may suitably be used. The gas to be introduced into the plasma apparatus is not particularly limited, so long as it effectively activates the surface, and argon, helium, nitrogen, oxygen or a gas mixture thereof, may, for example, be mentioned. Further, as the gas which activates the surface of the FAP coating film and which is substantially free from bringing about film reduction, a gas mixture of nitrogen and oxygen, or nitrogen gas, may be mentioned.

Now, the present invention will be described in further detail with reference to Examples and Comparative Examples. However, the present invention is by no means thereby restricted. Examples 1 to 17 and Examples 20 to 22 are Working Examples of the present invention, and Examples 18 and 19 are Comparative Examples. Examples 1 to 4 present syntheses of fluorinated aromatic compounds (B), Examples 5 to 19 present syntheses of FAP and results of evaluation of the basic properties, Example 20 presents evaluation of the adhesive properties of the coating films, Example 21 presents preparation of a void hole-introduced coating film, and Example 22 presents evaluation of the properties of an insulating film. Further, the molecular weight, the relative permittivity and Tg were measured by the following methods.

Molecular weight: A vacuum-dried FAP powder was subjected to gel permeation chromatography (GPC) to obtain the number average molecular weight as calculated as polystyrene. Tetrahydrofuran was used as a solvent.

Relative permittivity: A vacuum dried FAP powder was dissolved in cyclohexanone to obtain a 15% solution, which was filtered through a PTFE filter having a pore diameter of 0.2 $\mu$m. The obtained solution was spin-coated on a silicon wafer to form a coating film of from 400 to 700 nm. The spin-coating conditions were 2,000 rpm×30 seconds, and after prebaking by a hotplate at 100° C.×90 seconds and 200° C.×90 seconds, final baking was carried out in a nitrogen atmosphere at 425° C.×1 hour in a vertical furnace. Then, CV measurement by a mercury prober was carried out to obtain the relative permittivity at 1 MHz. As the thickness of the coating film, a value obtained by a spectroscopic ellipsometer, was used.

Tg: A vacuum dried FAP powder was dissolved in cyclohexanone to obtain a 15% solution, which was filtered through a PTFE filter having a pore diameter of 0.2 $\mu$m. The obtained solution was put on a silicon water by potting, and after prebaking at 200° C.×300 seconds by a hotplate, final baking was carried out in a nitrogen atmosphere at 425° C.×1 hour in a vertical furnace. The coating film was scraped off from the silicon wafer and subjected to DSC measurement to obtain Tg. In the DSC measurement, scanning was carried out under a condition of a temperature raising rate of 10° C./min in a nitrogen atmosphere from 40° C. to 450° C.

EXAMPLE 1

Preparation of Fluorinated Aromatic Compound (B) (Perfluoro(1,3,5-triphenylbenzene)).

Into a 2 l four-necked flask made of Pyrex (registered trademark) equipped with a Dimroth condenser, a thermocouple thermometer, a dropping funnel and a mechanical stirrer, 148.2 g of pentafluorobromobenzene and 500 ml of THF were charged. Then, under cooling in an ice bath, 600 ml of a THF solution containing 0.96 mol/l of ethyl magnesium bromide was gradually dropwise added with vigorous stirring, and after completion of the dropwise addition, stirring was continued for one hour. Then, 172.2 g of solid copper bromide (CuBr) was added thereto, followed by stirring for one hour, whereupon 200 ml of dioxane was added, followed by stirring for 30 minutes.

Then, 76.5 g of 1,3,5-triiodo-2,4,6-trifluorobenzene was added thereto, and the operation was switched from the ice bath to heating on an oil bath, and refluxing was continued for 16 hours with stirring. Thereafter, from the reaction solution, the solvent was distilled off for concentration, and the residue was put into water and rapidly cooled. A solid collected by filtration was extracted with 2,000 g of dichloropentafluoropropane, followed by evaporation to dryness by an evaporator to obtain 92 g of yellow crystals. Further, the crystals were recrystallized from hexane and vacuum-dried at 40° C. to obtain white crystals. From the mass spectrum and NMR analysis, the crystals were identified to be perfluoro(1,3,5-triphenylbenzene) (hereinafter referred to as 135TPB).

EXAMPLE 2
Preparation of Fluorinated Aromatic Compound (B) (Perfluoro(1,2,4-triphenylbenzene))

White crystals of perfluoro(1,2,4-triphenylbenzene) (hereinafter referred to as 124 TPB) were obtained in the same manner as in Example 1 except that 1,3,5-triiodo-2,4,6-trifluorobenzene was changed to 1,2,4-triiodo-3,5,6-trifluorobenzene.

EXAMPLE 3
Preparation of Fluorinated Aromatic Compound (B) (Compound Represented by the Following Formula)

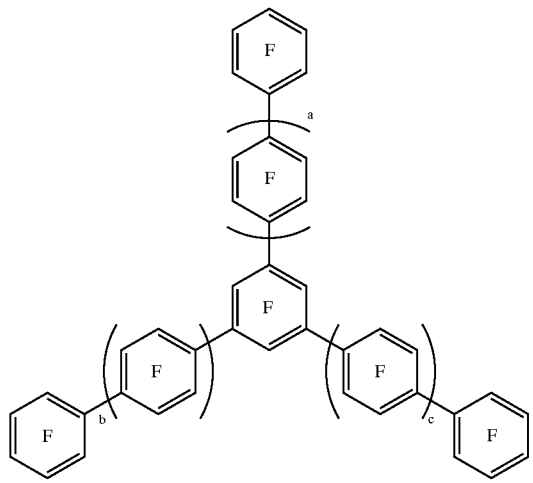

Into a 100 ml four-necked flask made of Pyrex (registered trademark) equipped with a Dimroth condenser, a thermocouple thermometer, a dropping funnel and a mechanical stirrer, 5.94 g of pentafluorobromobenzene and 30 ml of THF were charged. Then, under cooling in an ice bath, 25 ml of a THF solution containing 0.96 mol/l of ethyl magnesium bromide was gradually dropwise added with vigorous stirring, and after completion of the dropwise addition, stirring was continued for one hour. Then, 2.52 g of 135TPB obtained in Preparation Example 1 was added, and the operation was switched from the ice bath to heating on an oil bath, and heating was carried out at 60° C. for 12 hours with stirring.

Thereafter, the reaction solution was put into 300 ml of a vigorously stirred 0.2N hydrochloric acid aqueous solution, whereby white crystals were formed. The crystals were washed three times with pure water and then vacuum dried at 60° C. to obtain 5.1 g of white crystals. From the gas chromatography, mass spectrum and NMR analysis, the crystals were identified to be the fluorinated aromatic compound wherein each of the average values of a, b and c is about 1.2 (hereinafter referred to as TPB-4P).

EXAMPLE 4
Preparation of Fluorinated Aromatic Compound (B) (2,2',2",2'",2""',3,3"',4,4',4",4'",4""',5,5""',6,6',6", 6'",6""'-nonadecafluoro-5',5""'-bis(pentafluorophenyl)-5"-(tridecafluoro[1,1':3',1"-terphenyl]-5'-yl)-1,1':3',1":3'", 1"':3"',1""'-quinquephenyl)

Into a 2 l four-necked flask made of Pyrex (registered trademark) equipped with a Dimroth condenser, a thermocouple thermometer, a dropping funnel and a mechanical stirrer, 126.6 g of 1-bromo-2,4,6-trifluorobenzene and 400 ml of THF were charged. Then, under cooling in an ice bath, 600 ml of a THF solution containing 0.96 mol/l of ethyl magnesium bromide was gradually dropwise added with vigorous stirring, and after completion of the dropwise addition, stirring was continued for one hour. Then, 172.5 g of solid copper bromide (CuBr) was added thereto, followed by stirring for one hour, whereupon 200 ml of dioxane and 200 ml of toluene were added, followed by stirring for 30 minutes. Then, 55.3 g of 1,3,5-tribromo-2,4,6-trifluorobenzene was added thereto, and the operation was switched from the ice bath to heating on an oil bath, and refluxing was continued for 38 hours with stirring.

Thereafter, from the reaction solution, the solvent was distilled off for concentration, and the residue was put into water and rapidly cooled. A solid collected by filtration was extracted with 2,000 g of dichloropentafluoropropane and then, evaporated to dryness by an evaporator to obtain 50.3 g of yellow crystals. As a result of the NMR, gas chromatography and mass spectrum measurements, the crystals were identified to be 2,2',2",4,4',4",6,6',6"-nonafluoro-5'-(2,4,6-trifluorophenyl)-1,1':3',1"-terphenyl Then, into a 2 l four-necked flask made of Pyrex (registered trademark) equipped with a Dimroth condenser, a thermocouple thermometer, a dropping funnel and a mechanical stirrer, 41.8 g of crystals obtained as described above and 700 ml of methylene chloride were charged and stirred to obtain a uniform solution, and 3 g of aluminum bromide was further added. 60 g of bromine and 200 ml of methylene chloride were charged into a dropping funnel, and gradually dropwise added into the flask with vigorous stirring at room temperature. After completion of the dropwise addition, the reaction solution was heated on an oil bath and refluxed for 3 hours. After cooling to room temperature, the reaction solution was washed twice with 1 l of a saturated sodium thiosulfate aqueous solution and then with 500 ml of a saturated sodium chloride aqueous solution. The organic layer was dried over magnesium sulfate.

The solvent was distilled off, and the remaining yellow crystals were recrystallized from hexane to obtain 58.5 g of slightly yellow crystals. As a result of the NMR, gas chromatography and mass spectrum measurements, the crystals were identified to be 3,3",5,5"-tetrabromo-5'-(3,5-dibromo-2,4,6-trifluorophenyl)-2,2',2",4,4',4",6,6',6"-nonafluoro-1,1':3',1"-terphenyl as a hexabromo compound.

Then, into a 1 l four-necked flask made of Pyrex (registered trademark) equipped with a Dimroth condenser, a thermocouple thermometer, a dropping funnel and a mechanical stirrer, 74.1 g of pentafluorobromobenzene and 200 ml of THF were charged. Under cooling in an ice bath, 300 ml of a THF solution containing 0.96 mol/l of ethyl magnesium bromide was gradually dropwise added with vigorous stirring, and after completion of the dropwise addition, stirring was continued for 1 hour. Then, 86.1 g of solid copper bromide (CuBr) was added, followed by stirring for 1 hour, whereupon 100 ml of dioxane and 200 ml of toluene were added, followed by stirring for 30 minutes. Then, 37.3 g of the hexabromo compound obtained as described above, was added, and the operation was switched from the ice bath to heating on an oil bath, and refluxing was continued for 45 hours with stirring.

Thereafter, from the reaction solution, the solvent was distilled off for concentration, and the residue was put into water and rapidly cooled. A solid collected by filtration was extracted with 1,500 g of chloroform and then, evaporated to dryness by an evaporator to obtain 44.1 g of yellow crystals. Further, recrystallization was carried out twice from a toluene/hexane mixed solvent, followed by vacuum drying at 60° C. to obtain 22.9 g of white crystals. As a result of the NMR, gas chromatograph and mass spectrum, the crystals were identified to be 2,2',2'',2''',2'''',3,3'''',4,4',4'',4''', 4'''', 5,5'''', 6,6',6'',6''', 6''''-nonadecafluoro-5', 5''''-bis (pentafluorophenyl)-5''-(tridecafluoro[1,1':3',1''-terphenyl]-5'-yl)-1,1':3',1'':3'', 1''':3''',1''''-quinquephenyl represented by the following formula (hereinafter referred to as TPB-35P). The molecular weight of TPB-35P was 1,700.

EXAMPLE 5

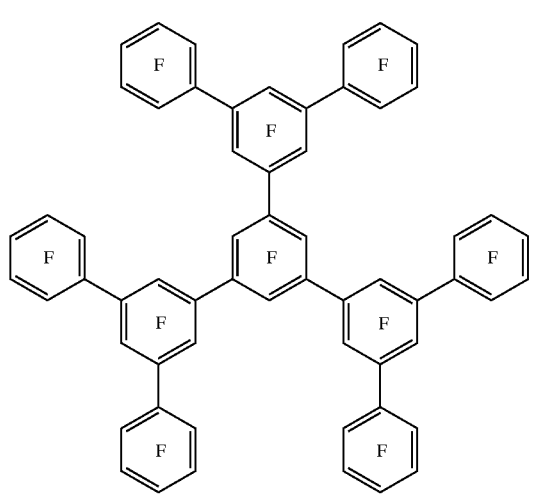

Preparation of FAP by the Method ① Employing the Fluorinated Aromatic Compound (B) and the Compound (Y1)

Into a 100 ml four-necked flask made of Pyrex (registered trademark) equipped with a Dimroth condenser, a thermocouple thermometer and a mechanical stirrer, 2.19 g of TPB-4P obtained in Example 3, 1.37 g of 4-(4-fluorophenylethyl)phenol as the compound (Y1), 35 g of N,N-dimethylacetamide (hereinafter referred to as DMAc) and 15 g of toluene were charged. The mixture was heated on an oil bath with stirring, and when the liquid temperature became 80° C., 1.84 g of potassium carbonate was quickly added, followed by heating at 120° C. for 4 hours with stirring.

Thereafter, the reaction solution was cooled to room temperature. The reaction solution was gradually put into 400 ml of a vigorously stirred mixed solution of pure water containing 7.1 g of acetic acid/methanol (volume ratio: about 1/1), whereby fine brown powdery substance was precipitated. This fine brown powdery substance was collected by filtration and further washed five times with pure water and then vacuum-dried at 80° C. for 15 hours to obtain 2.76 g of whitish gray powdery FAP. The obtained FAP had an ether linkage and an average of 3.0 ethynyl groups and the molecular weight was 1,600, and the relative permittivity was 2.4. In the DSC measurement, no transition point or no heat generation or absorption peak was observed, and Tg was at least 450° C.

EXAMPLE 6

Preparation of FAP by the Method ① Employing the Fluorinated Aromatic Compound (B) and the Compound (Y1)

2.5 g of grayish white powdery FAP was obtained in the same manner as in Example 5 except that 1.15 g of 4-phenylethylphenol was used instead of 1.37 g of 4-(4-fluorophenylethyl)phenol. The obtained FAP had an ether linkage and an average of 2.8 ethynyl groups, and the molecular weight was 1,500, and the relative permittivity was 2.4. In the DSC measurement, no transition point or no heat generation or absorption peak was observed, and Tg was at least 450° C.

EXAMPLE 7

Preparation of FAP by the Method ① Employing the Fluorinated Aromatic Compound (B) and the Compound (Y1)

4.89 g of white powdery FAP was obtained in the same manner as in Example 5 except that 4.56 g of TPB-35P obtained in Example 4 was employed instead of 2.19 g of TPB-4P, and the amount of 4-(4-fluorophenylethyl)phenol was changed to 1.9 g. The obtained FAP had an ether linkage and an average of 3.1 ethynyl groups, and the molecular weight was 2,200, and the relative permittivity was 2.3. In the DSC measurement, no transition point or no heat generation or absorption peak was observed, and Tg was at least 450° C.

EXAMPLE 8

Preparation of FAP by the Method ② Employing the Fluorinated Aromatic Compound (B), the Compound (Y1) and the Compound (Y2)

Into a 100 ml four-necked flask made of Pyrex (registered trademark) equipped with a Dimroth condenser, a thermocouple thermometer and a mechanical stirrer, 3.78 g of 135TPB obtained in Example 1, 0.33 g of 1,3-dihydroxybenzene as the compound (Y2), 60 g of DMAc, 5 g of toluene and 2.21 g of potassium carbonate were charged. On an oil bath, the mixture was heated at 130° C. for 5 hours with stirring, and then, 2.12 g of 4-(4-fluorophenylethyl)phenol as the compound (Y1) was introduced, followed by further heating at 120° C. for 3 hours.

Then, the reaction solution was cooled to room temperature and gradually introduced into 500 ml of a vigorously stirred mixed solution of pure water containing 8 g of acetic acid/methanol (volume ratio: about 1/1), whereby a brown powdery substance was precipitated. This brown powdery substance was collected by filtration and further washed five times with pure water and then vacuum-dried at 80° C. for 15 hours to obtain slightly brown powdery FAP. The obtained FAP had an ether linkage and an average of 3.7 ethynyl groups and the molecular weight was 2,200, and the relative permittivity was 2.5. In the DSC measurement, no transition point or no heat generation or absorption peak was observed, and Tg was at least 450° C.

EXAMPLE 9

Preparation of FAP by the Method ② Employing the Fluorinated Aromatic Compound (B), the Compound (Y1) and the Compound (Y2)

5.5 g of slightly brown powdery FAP was obtained in the same manner as in Example 8 except that the amount of 1,3-dihydroxybenzene was changed to 0.50 g. The obtained FAP had an ether linkage and an average of 8.3 ethynyl groups, and the molecular weight was 5,000, and the relative permittivity was 2.4. In the DSC measurement, no transition point or no heat generation or absorption peak was observed, and Tg was at least 450° C.

EXAMPLE 10

Preparation of FAP by the Method ② Employing the Fluorinated Aromatic Compound (B), the Compound (Y1) and the Compound (Y2)

5.8 g of white powdery FAP was obtained in the same manner as in Example 8 except that 1.40 g of 9,9-bis(4-hydroxyphenyl)fluorene was used instead of 0.33 g of 1,3-dihydroxybenzene. The obtained FAP had an ether linkage and an average of 8.4 ethynyl groups, and the molecular weight was 5,800, and the relative permittivity was 2.3. In the DSC measurement, no transition point or no heat generation or absorption peak was observed, and Tg was at least 450° C.

EXAMPLE 11
Preparation of FAP by the Method ② Employing the Fluorinated Aromatic Compound (B), the Compound (Y1) and the Compound (Y2)

5.3 g of white powdery FAP was obtained in the same manner as in Example 10 except that 3.79 g of 124TPB obtained in Example 2 was used instead of 3.78 g of 135TPB. The obtained FAP had an ether linkage and an average of 11.8 ethynyl groups, and the molecular weight was 8,200, and the relative permittivity was 2.4. In the DSC measurement, no transition point or no heat generation or absorption peak was observed, and Tg was at least 450° C.

EXAMPLE 12
Preparation of FAP by the Method ② Employing the Fluorinated Aromatic Compound (B), the Compound (W), the Compound (Y1) and the Compound (Y2)

Into a 100 ml four-necked flask made of Pyrex (registered trademark) equipped with a Dimroth condenser, a thermocouple thermometer and a mechanical stirrer, was flushed with nitrogen and then, 3.78 g of 135TPB, 0.99 g of 1,3-dihydroxybenzene as the compound (Y2), 2.00 g of perfluorobiphenyl as the compound (W), 60 g of N-methyl pyrrolidone and 1.86 g of potassium carbonate were charged. The mixture was heated at 160° C. for 15 hours on an oil bath with stirring, and then, 0.85 g of potassium carbonate and 1.91 g of 4-(4-fluorophenylethyl)phenol as the compound (Y1), were introduced, followed by further heating at 120° C. for 3 hours.

Then, the reaction solution was cooled to room temperature and gradually introduced into 400 ml of a vigorously stirred mixed solution of pure water containing 8 g of acetic acid/methanol (volume ratio: about 1/1), whereby a brown powdery substance was precipitated. This brown powdery substance was collected by filtration and further washed five times with pure water and then vacuum-dried at 80° C. for 15 hours to obtain 6.8 g of slightly brown powdery FAP. The obtained FAP had an ether linkage and an average of 9.6 ethynyl groups, and the molecular weight was 8,700, and the relative permittivity was 2.5, and Tg was 384° C.

EXAMPLE 13
Preparation of FAP by the Method ② Employing the Fluorinated Aromatic Compound (B), the Compound (W), the Compound (Y1) and the Compound (Y2)

8.7 g of brown powdery FAP was obtained in the same manner as in Example 12 except that a mixture of 2.02 g of dihydroxy-2,2-diphenylhexafluoropropane and 0.40 g of 1,2,4-trihydroxybenzene was used instead of 0.99 g of 1,3-dihydroxybenzene. The obtained FAP had an ether linkage and an average of 16.8 ethynyl groups, and the molecular weight was 1,700, and the relative permittivity was 2.4. In the DSC measurement, no transition point or no heat generation or absorption peak was observed, and Tg was at least 450° C.

EXAMPLE 14
Preparation of FAP by the Method ③ Employing the Fluorinated Aromatic Compound (B), the Aromatic Compound (Z) and the Compound (Y2)

A 100 ml four-necked flask made of Pyrex (registered trademark) equipped with a Dimroth condenser, a thermocouple thermometer and a mechanical stirrer, was flushed with nitrogen and then, 2.52 g of 135TPB, 1.66 g of 4-phenylethynylnonafluorobiphenyl as the compound (Z), 0.51 g of 1,3,5-trihydroxybenzene as the compound (Y2), 40 g of DMAc and further 1.25 g of potassium carbonate, were charged. On an oil bath, the mixture was heated at 150° C. for 6 hours with stirring.

Then, the reaction solution was cooled to room temperature and gradually introduced into 200 ml of a vigorously stirred 0.2N hydrochloric acid aqueous solution, whereby fine brown powdery substance was precipitated. This slightly brown powdery substance was collected by filtration and dissolved in about 50 cc of tetrahydrofuran. This solution was gradually introduced into 300 ml of a vigorously stirred mixed solution of pure water/methanol (volume ratio: about 1/1), to obtain a grayish white precipitate, which was washed five times with pure water and then vacuum-dried at 80° C. for 20 hours to obtain 4.2 g of white powdery FAP. The obtained FAP had an ether linkage and an average of 13.5 ethynyl groups, and the molecular weight was 15,000, and the relative permittivity was 2.3. In the DSC measurement, no transition point or no heat generation or absorption peak was observed, and Tg was at least 450° C.

EXAMPLE 15
Preparation of FAP by the Method ③ Employing the Fluorinated Aromatic Compound (B), the Aromatic Compound (Z) and the Compound (Y2)

5.5 g of brown powdery FAP was obtained in the same manner as in Example 14 except that 2.02 g of dihydroxy-2,2-diphenylhexafluoropropane was used instead of 0.51 g of 1,3,5-trihydroxybenzene. The obtained FAP had an ether linkage and an average of 8.7 ethynyl groups, and the molecular weight was 1,300, and the relative permittivity was 2.4. In the DSC measurement, no transition point or no heat generation or absorption peak was observed, and Tg was at least 450° C.

EXAMPLE 16
Preparation of FAP by the Method ③ Employing the Fluorinated Aromatic Compound (B), the Aromatic Compound (Z) and the Compound (Y2)

5.2 g of white powdery FAP was obtained in the same manner as in Example 14 except that 1.52 g of decafluorotran was used instead of 1.66 g of 4-phenylethynylnonafluorobiphenyl, and 1.95 g of 9,9-bis(4-hydroxyphenyl)fluorene was used instead of 0.51 g of 1,3,5-trihydroxybenzene. The obtained FAP had an ether linkage and an average of 6.6 ethynyl groups, and the molecular weight was 9,000, and the relative permittivity was 2.3. In the DSC measurement, no transition point or no heat generation or absorption peak was observed, and Tg was at least 450° C.

EXAMPLE 17
Preparation of FAP by the Method ③ Employing the Fluorinated Aromatic Compound (B), the Aromatic Compound (Z), the Compound (W) and the Compound (Y2)

A 100 ml four-necked flask made of Pyrex (registered trademark) equipped with a Dimroth condenser, a thermocouple thermometer and a mechanical stirrer, was flushed with nitrogen and then, 2.52 g of 135TPB, 1.42 g of 4-phenylethynylnonafluorobiphenyl as the compound (Z), 0.67 g of 1,3,5-trihydroxybenzene as the compound (Y2), 0.66 g of perfluorobiphenyl as the compound (W), 40 g of DMAc and 1.30 g of potassium carbonate, were charged. On an oil bath, the mixture was heated at 130° C. for 6 hours with stirring.

The reaction solution was cooled to room temperature and gradually introduced into 200 ml of a vigorously stirred 0.2 N hydrochloric acid aqueous solution, whereby fine brown powdery substance was precipitated. This fine brown powdery substance was collected by filtration and dissolved in about 50 cc of tetrahydrofuran. This solution was gradually introduced into 300 ml of a vigorously stirred mixed solution of pure water/methanol (volume ratio: about 1/1), to obtain a grayish white precipitate, which was washed five times with pure water and then vacuum-dried at 80° C. for 20 hours to obtain 4.5 g of white powdery FAP. The obtained FAP had an ether linkage and an average of 6.8 ethynyl groups, and the molecular weight was 9,800, and the relative permittivity was 2.3. In the DSC measurement, no transition point or no heat generation or absorption peak was observed, and Tg was at least 450° C.

EXAMPLE 18 (COMPARATIVE EXAMPLE)
Preparation of Known FAP

A 100 ml four-necked flask made of Pyrex (registered trademark) equipped with a Dimroth condenser, a thermocouple thermometer and a mechanical stirrer, was flushed with nitrogen, and then, 2.51 g of perfluorobiphenyl, 1.68 g of dihydroxy-2,2-diphenylhexafluoropropane, 40 g of DMAc and 5 g of toluene were charged. Further, 1.66 g of potassium carbonate was charged. On an oil bath, the mixture was heated at 120° C. for 5 hours with stirring, whereupon 0.7 g of potassium carbonate and 1.05 g of phenylethynyl phenol were introduced, followed by heating at 120° C. for further 3 hours.

The reaction solution was cooled to room temperature and gradually introduced into 500 ml of a vigorously stirred mixed solution of pure water containing 8 g of acetic acid/methanol (volume ratio: about 1/1), whereby a fine brown powdery substance was precipitated. This fine brown powdery substance was collected by filtration, further washed five times with pure water and then vacuum-dried at 80° C. for 15 hours to obtain 4.2 g of fine brown powdery FAP. The obtained FAP had a molecular weight of 5,100, a relative permittivity of 2.8 and a Tg of 295° C.

EXAMPLE 19 (COMPARATIVE EXAMPLE)
Evaluation of the Properties of FAP Having no Crosslinkable Functional Group The relative permittivity and Tg of TPB-35P obtained in Example 4 and having a molecular weight of 1,700, were 2.4 and 121° C., respectively, with respect to a film after prebaking at 200° C. When subjected to final baking at 425° C., the film was all evaporated and disappeared.

EXAMPLE 20
Adhesion Between the FPA Coating Film and the Substrate

A part of the cyclohexanone 15% solution of FAP obtained in Example 10 (hereinafter referred to as the solution 10) was taken out and aminophenyltrimethoxysilane was added in an amount of 3 mass % based on FAP to obtain a solution 10-1. Further, instead of aminophenyltrimethoxysilane, γ-aminopropylethoxysilane was added in an amount of 3 mass % based on FAP to obtain a solution 10-2. Then, on 4-inch silicon wafers having p-SiN having a film thickness of 200 nm (formed into a film by a plasma CVD method using a gas mixture of a monosilane, ammonia and nitrogen as the starting material), p-SiO having a film thickness of 300 nm (formed into a film by a plasma CVD method using a gas mixture of monosilane and oxygen dinitride as the starting material), Al having a thickness of 500 nm (formed into a film by a sputtering method) and TiN having a film thickness of 50 nm (formed into a film by a sputtering method) respectively formed, the solution 10, the solution 10-1 and the solution 10-2 were spin-coated to form coating films.

The spinning rotational speed was adjusted so that the coating film thickness would be 500 nm. After prebaking at 100° C.×90 seconds and at 200° C.×90 seconds by a hotplate, final baking was carried out in a nitrogen atmosphere at 425° C.×1 hour in a vertical furnace. With respect to such samples, the adhesion between the FAP coating film and the substrate was evaluated by a cross cut peel test as prescribed in JIS D0202.

With respect to the coating films obtained from the solution 10, no peeling was observed of the coating films formed on p-SiO and Al. Among cross cut sections of the coating film formed on p-SiN, 20% was peeled, and among cross cut sections of the coating film formed on Ti, 80% was peeled.

With respect to the coating films obtained from the solution 10-1, no peeling was observed of any one of the coating films formed on p-SiN, p-SiO, Al and TiN.

With respect to the coating films obtained from the solution 10-2, no peeling was observed of any one of the coating films formed on p-SiN, p-SiO, Al and TiN.

From this Example, it has been made clear that an adhesion promoter such as aminosilane is effective for the improvement of the adhesion of FAP.

EXAMPLE 21
Preparation of a FAP Coating Film Containing Void Holes

To a cyclohexanone 15% solution of FAP prepared in Example 14, poly(ε-caprolacton) having a number average molecular weight of 3,000 was added in an amount of 25 mass % based on FAP, and dissolved, followed by filtration with a PTFE filter (pore diameter: 0.2 μm) to obtain a uniform transparent solution (hereinafter referred to as a solution 14). The solution 14 was spin-coated on a 4 inch silicon wafer, followed by baking to form a coating film. The spinning conditions were 2,500 rpm×30 seconds, and prebaking and final baking were carried out in the same manner as in Example 20. The cross section of the obtained coating film was observed by SEM, whereby presence of fine void holes of nanometer order, was confirmed. The relative permittivity of the coating film was 1.8. Further, no peeling or breakage of the film was observed by a cross cut peel test.

EXAMPLE 22
Evaluation as an Interlayer Insulating Film

From the solution 10, the solution 10-1, the solution 14 and the cyclohexanone 15% solution prepared in Example 18 (hereinafter referred to as a solution 18), a laminated film of silicon wafer/p-SiO (300 nm)/FAP coating film (500 nm)/p-SiN (50 nm)/p-SiO (500 nm) was prepared by the following method.

The solution was spin-coated on a 4 inch silicon wafer having a p-SiO film (film thickness: 300 nm) formed, to form a FAP coating film having a thickness of 500 nm in the same manner as in Example 20. Then, 50 nm of a silicon nitride film was formed by a gas mixture of monosilane, ammonia and nitrogen, and then, a silicon oxide film having a thickness of 500 nm was formed by a gas mixture of monosilane and oxygen dinitride.

The obtained laminate was baked at 425° C. for 60 minutes in a hydrogen atmosphere, and the cracking resistance by thermal stress was examined by a metal microscope. The results are shown below.

With the laminate formed from the solution 10, no cracking or no other defects were observed.

With the laminate formed from the solution 10-1, no cracking or no other defects were observed.

With the laminate formed from the solution 14, no cracking or no other defects were observed.

With the laminate formed from the solution 18, cracks with widths of about 1 μm were formed over the entire surface, and partial peeling was observed between FAP and p-SiN.

From this Example, it has been found that FAP of the present invention is easy in lamination with an inorganic film as compared with known FAP and is excellent in the applicability as an interlayer insulating film.

INDUSTRIAL APPLICABILITY

FAP of the present invention is excellent in heat resistance. Particularly, the glass transition temperature Tg is high, and the relative permittivity is low. Such FAP is excellent in the applicability as an insulating film for electronic devices and an insulating film for multilayered wiring boards. Further, such an insulating film has a low relative permittivity and is capable of accomplishing a high performance such as a reduction in the signal transmission delay time of an element, and whereby, high reliability can be obtained by the excellent mechanical properties in a high temperature range.

The entire disclosure of Japanese Patent Application No. 2001-212379 filed on Jul. 12, 2001 including specification, claims and summary is incorporated herein by reference in its entirety.

What is claimed is:

1. A fluorinated aromatic polymer which contains two or more crosslinkable functional groups (A) per molecule and has a number average molecular weight of from $1 \times 10^3$ to $5 \times 10^5$ and an ether linkage and which is produced from a branched fluorinated aromatic compound (B) represented by the following formula 1 by at least one method selected from the group consisting of the following methods ①, ② and ③:

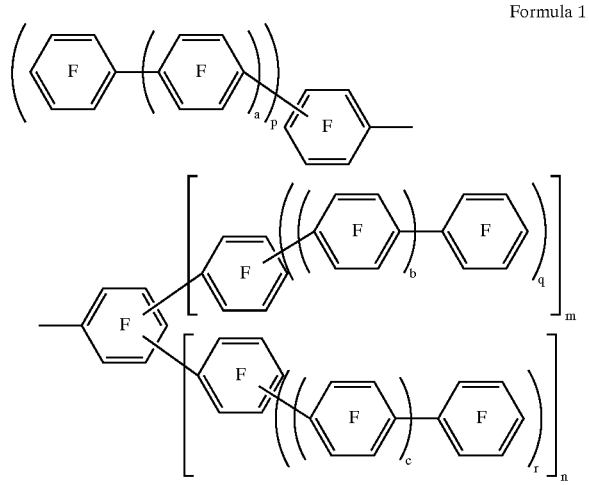

Formula 1 wherein each of m and n which are independent of each other, is an integer of from 1 to 4, each of p, q and r which are independent of one another, is 0 or an integer of from 1 to 5, and each of a, b and c which are independent of one another, is 0 or an integer of from 1 to 3, provided that $2 \leq m+n \leq 5$;

① a method in which a branched fluorinated aromatic compound (B) represented by the above formula 1 and a compound (Y1) having a crosslinkable functional group (A) and at least one phenolic hydroxyl group, are subjected to a condensation reaction in the presence of a HF-removing agent;

② a method in which the fluorinated aromatic compound (B), a compound (Y1) having a crosslinkable functional group (A) and at least one phenolic hydroxyl group, and a compound (Y2) having no crosslinkable functional group and two or more phenolic hydroxyl groups, are subjected to a condensation reaction in the presence of a HF-removing agent;

③ a method in which the fluorinated aromatic compound (B), an aromatic compound (Z) having a crosslinkable functional group (A) and having a fluorinated substituent on the aromatic ring, and a compound (Y2) having no crosslinkable functional group and two or more phenolic hydroxyl groups, are subjected to a condensation reaction in the presence of a HF-removing agent.

2. The fluorinated aromatic polymer according to claim 1, wherein the fluorinated aromatic compound (B) is perfluoro(1,3,5-triphenylbenzene) or perfluoro(1,2,5-triphenylbenzene) represented by the following formula 2:

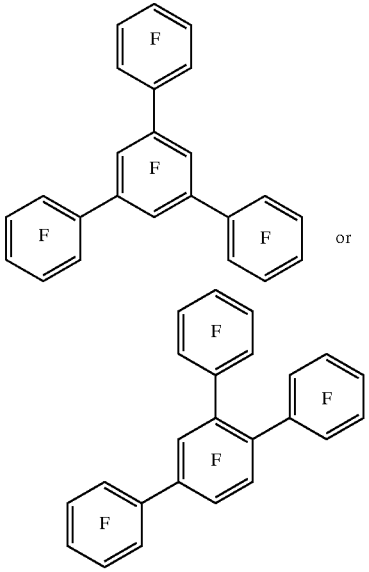

Formula 2

3. The fluorinated aromatic polymer according to claim 1, wherein the crosslinkable functional group (A) is an ethynyl group.

4. The fluorinated aromatic polymer according to claim 2, wherein the crosslinkable functional group (A) is an ethynyl group.

5. An insulating film for electronic devices, which is made of the fluorinated aromatic polymer as defined in claim 1.

6. An insulating film for multilayered wiring boards, which is made of the fluorinated aromatic polymer as defined in claim 1.

7. The insulating film according to claim 5, which contains void holes in the insulating film.

8. The insulating film according to claim 6, which contains void holes in the insulating film.

9. The fluorinated aromatic polymer according to claim 1, wherein the number average molecular weight is from $1 \times 10^3$ to $1.5 \times 10^4$.

10. A composition comprising the fluorinated aromatic polymer of claim 1 in crosslinked form.

11. The fluorinated aromatic polymer of claim 1, wherein n+m in formula 1 is from 2 to 3, each of p, q and r, independently of one another, is from 0 to 3, and each of a, b and c, independently of one another, is from 0 to 2.

12. The fluorinated aromatic polymer of claim 1, wherein the crosslinkable functional group (A) is at least one selected from the group consisting of an ethynyl group, a 1-oxocyclopenta-2,5-dien-3-yl group, a cyano group, an alkoxysilyl group, a diarylhydroxymethyl group and a hydroxyfluorenyl group.

13. The fluorinated aromatic polymer of claim 1, wherein from 3 to 20 of the crosslinkable functional groups (A) are present per molecule.

14. A fluorinated aromatic polymer of claim 1, obtained by method ①.

15. A crosslinked fluorinated aromatic polymer obtained by crosslinking the fluorinated aromatic polymer of claim 1.

16. A fluorinated aromatic polymer of claim 1, obtained by method ① or ②, wherein compound (Y1) has 2 phenolic hydroxy groups.

17. Fluorinated aromatic polymer of claim 1, wherein the number average molecular weight is from 1,500 to 50,000.

18. The fluorinated aromatic polymer of claim 1, comprising 4-(4-fluorophenylethyl) phenol.

19. The fluoro aromatic polymer of claim 1, comprising 4(4-fluorophenylethyl)phenol and 1,3-dihydroxybenzene.

20. The fluorinated aromatic polymer of claim 1, further comprising perfluorobiphenyl.

* * * * *

UNITED STATES PATENT AND TRADEMARK OFFICE
CERTIFICATE OF CORRECTION

PATENT NO.    : 6,881,811 B2  
DATED         : April 19, 2005  
INVENTOR(S)   : Shunsuke Yokotsuka et al.

It is certified that error appears in the above-identified patent and that said Letters Patent is hereby corrected as shown below:

Column 11,  
Line 32, "4,4'-dihydroxytran" should read -- 4,4'-dihydroxytolan --.  
Line 32, "3,3'-dihydroxytran" should read -- 3,3'-dihydroxytolan --.  
Line 63, "decafluorotran" should read -- decafluorotolan --.

Column 12,  
Line 20, "dimethylformaide" should read -- dimethylformamide --.  
Line 20, "ethylsulfoxide" should read -- dimethylsulfoxide --.

Column 21,  
Line 7, Example 5,

"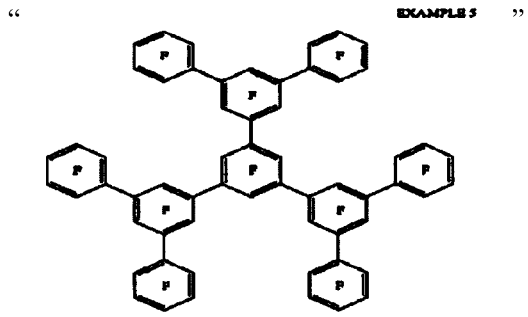"

should read

-- 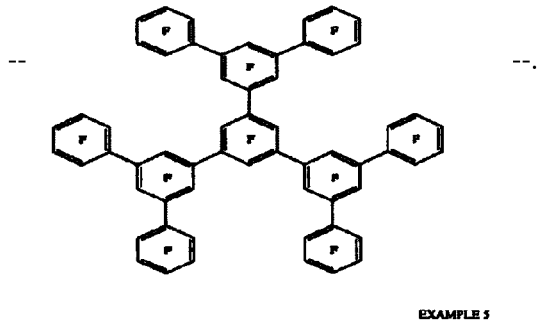 --.

Lines 34-35 and 63-64, "4-(4-fluorophenylethyl)phenol" should read  
-- 4-(4-fluorophenylethynyl)phenol --.  
Line 63, "4-phenylethylphenol" should read -- 4-phenylethynylphenol --.

Column 22,  
Lines 11 and 30-31, "4-(4-fluorophenylethyl)phenol" should read  
-- 4-(4-fluorophenylethynyl)phenol --.

UNITED STATES PATENT AND TRADEMARK OFFICE
CERTIFICATE OF CORRECTION

PATENT NO.   : 6,881,811 B2
DATED         : April 19, 2005
INVENTOR(S)  : Shunsuke Yokotsuka et al.

It is certified that error appears in the above-identified patent and that said Letters Patent is hereby corrected as shown below:

<u>Column 23,</u>
Line 32, "4-(4-fluorophenylethyl)phenol" should read
-- 4-(4-fluorophenylethynyl)phenol --.

<u>Column 24,</u>
Lines 43-44, "decafluorotran" should read -- decafluorotolan --.

<u>Column 28,</u>
Lines 20-21, "perfluoro(1, 2, 5-triphenylbenzene)" should read
-- perfluoro(1, 2, 4-triphenylbenzene) --.

Signed and Sealed this

Thirty-first Day of January, 2006

JON W. DUDAS
*Director of the United States Patent and Trademark Office*